United States Patent
Ko et al.

(10) Patent No.: US 8,344,783 B2
(45) Date of Patent: Jan. 1, 2013

(54) DELAY CIRCUIT AND METHOD FOR DELAYING SIGNAL

(75) Inventors: Jae Bum Ko, Ichon-shi (KR); Jong Chern Lee, Ichon-shi (KR); Sang Jin Byeon, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 105 days.

(21) Appl. No.: 12/970,623

(22) Filed: Dec. 16, 2010

(65) Prior Publication Data

US 2011/0204950 A1 Aug. 25, 2011

(30) Foreign Application Priority Data

Feb. 25, 2010 (KR) .................... 10-2010-0017287

(51) Int. Cl.
  *H03H 11/26* (2006.01)
(52) U.S. Cl. .................... 327/278; 327/276; 327/277
(58) Field of Classification Search .......... 327/276, 327/277, 278
See application file for complete search history.

(56) References Cited

U.S. PATENT DOCUMENTS

| 5,095,232 A | 3/1992 | Hirano et al. |
| 7,586,351 B2 * | 9/2009 | Aoki .............................. 327/263 |
| 2005/0134348 A1 | 6/2005 | Florescu |

FOREIGN PATENT DOCUMENTS

| JP | 06-112783 | 4/1994 |
| JP | 11-272357 | 10/1999 |
| JP | 2009-169981 | 7/2009 |
| KR | 10-0589573 B1 | 6/2006 |
| KR | 10-0642441 B1 | 10/2006 |

* cited by examiner

*Primary Examiner* — John Poos
(74) *Attorney, Agent, or Firm* — William Park & Associates Ltd.

(57) ABSTRACT

A delay circuit includes: a delay unit configured to receive a clock signal, delay an input signal sequentially by a predetermined time interval, and output a plurality of first delayed signals; and an option unit configured to select one of the plurality of first delayed signals based on one or more select signals, and output a second delayed signal.

15 Claims, 8 Drawing Sheets

510

520

DELAY CIRCUIT AND METHOD FOR DELAYING SIGNAL

CROSS-REFERENCES TO RELATED APPLICATION

The present application claims priority under 35 U.S.C. §119(a) to Korean Patent Application No. 10-2010-0017287, filed on Feb. 25, 2010, in the Korean Intellectual Property Office, which is incorporated herein by reference in its entirety as if set forth in full.

BACKGROUND

1. Technical Field

The present invention relates to a semiconductor integrated circuit, and more particularly, to a delay circuit which may be used in a semiconductor integrated circuit.

2. Related Art

A delay circuit delays an input signal by a predetermined time and outputs a delayed signal. In a semiconductor apparatus, a delay circuit is indispensably used in a sense amplifier to secure a data stabilization time and in a non-overlap clock signal generation circuit.

As a way of obtaining a delayed signal, RC delay is generally adopted. In RC delay mechanism, current flow is delayed based on the combination of impedance elements such as a resistor and a capacitor. A delay circuit of a semiconductor memory apparatus is made of a delay circuit in which a plurality of inverter terminals are coupled with one another. In an actual delay circuit, CMOS (complementary MOS) transistors, in which PMOS transistors and NMOS transistors are coupled in series, are used as the plurality of inverter terminals. The delay circuit includes capacitors and resistors in addition to the configuration of the CMOS transistors such that an input signal is delayed through RC delay and an output signal is generated.

FIG. 1 is a diagram illustrating a typical delay circuit. Referring to FIG. 1, a delay circuit is configured such that an input signal in is delayed, inverted and outputted through CMOS transistors including a resistor R and a capacitor C, and a resultant signal is delayed, inverted and outputted through CMOS transistors with a similar configuration, such that the input signal in is finally delayed and outputted as an output signal out. The delay circuit includes NMOS transistors and PMOS transistors which receive three control signals TCM0 through TCM2 and inverted signals TCM0B through TCM2B of the three control signals. By controlling current amounts of current paths to be delayed by these control signals, a delay time of the delay circuit may be controlled.

In the typical delay circuit of a semiconductor apparatus, since impedance elements such as resistors and capacitors occupy a relatively large area, the degree of integration of a semiconductor apparatus may be adversely influenced.

Also, as a semiconductor apparatus is gradually highly integrated, the characteristics of transistors tend to significantly change depending upon PVT (process, voltage and temperature) variations. In the case of the delay circuit shown in FIG. 1, because a delay time can be controlled depending on the current flow through the transistors, the delay time significantly changes depending on the PVT variations when compared to a delay circuit realized to occupy a larger area. If the delay time becomes unstable in this way, margins of signals, which are inputted/outputted in conformity with timings, are limited, and high speed operation of a semiconductor apparatus may be affected.

SUMMARY

Accordingly, there is a need for an improved delay circuit of a semiconductor apparatus that may obviate the above-mentioned problems. It should be understood, however, that some aspects of the invention may not necessarily obviate the problem.

In the following description, certain aspects and embodiments will become evident. It should be understood that these aspects and embodiments are merely exemplary, and the invention, in its broadest sense, could be practiced without having one or more features of these aspects and embodiments.

According to one aspect of the present invention, a delay circuit includes: a delay unit configured to delay an input signal sequentially by a predetermined time interval in response to a clock signal, and output a plurality of first delayed signals; and an option unit configured to select one of the plurality of first delayed signals based on one or more select signals, and output a second delayed signal.

According to another aspect of the present invention, a delay circuit includes: a clock multiplication unit configured to multiply a clock signal and generate a plurality of multiplied clock signals which have different cycles; a delay unit configured to delay an input signal sequentially by a predetermined time interval through performing flip-flop operations in synchronization with the plurality of multiplied clock signals, and generate a plurality of first delayed signals; and an option unit configured to receive the plurality of multiplied clock signals, edge-trigger the plurality of first delayed signals, select one of the plurality of first delayed signals, which are edge-triggered, based on one or more select signals, and output a second delayed signal.

According to still another aspect of the present invention, a method for delaying a signal includes the steps of: receiving a clock signal and generating a plurality of multiplied clock signals which have different cycles; receiving an input signal, performing sequentially flip-flop operations a multitude of times in synchronization with the plurality of multiplied clock signals, and generating a plurality of first delayed signals; edge-triggering the plurality first delayed signals in response to the plurality of multiplied clock signals; and outputting one of the first delayed signals which are edge-triggered, as a second delayed signal.

According to still another aspect of the present invention, a semiconductor apparatus includes a delay circuit. The delay circuit in turn includes: a delay unit configured to delay an input signal sequentially by a predetermined time interval in response to a clock signal, and output a plurality of first delayed signals; and a multiplexer configured to select one of the plurality of first delayed signals based on one or more select signals, and output a second delayed signal.

BRIEF DESCRIPTION OF THE DRAWINGS

The accompanying drawings, which are incorporated in and constitute a part of this specification, explain various embodiments consistent with the invention and, together with the description, serve to explain the principles of the invention.

DETAILED DESCRIPTION

Figure 1:
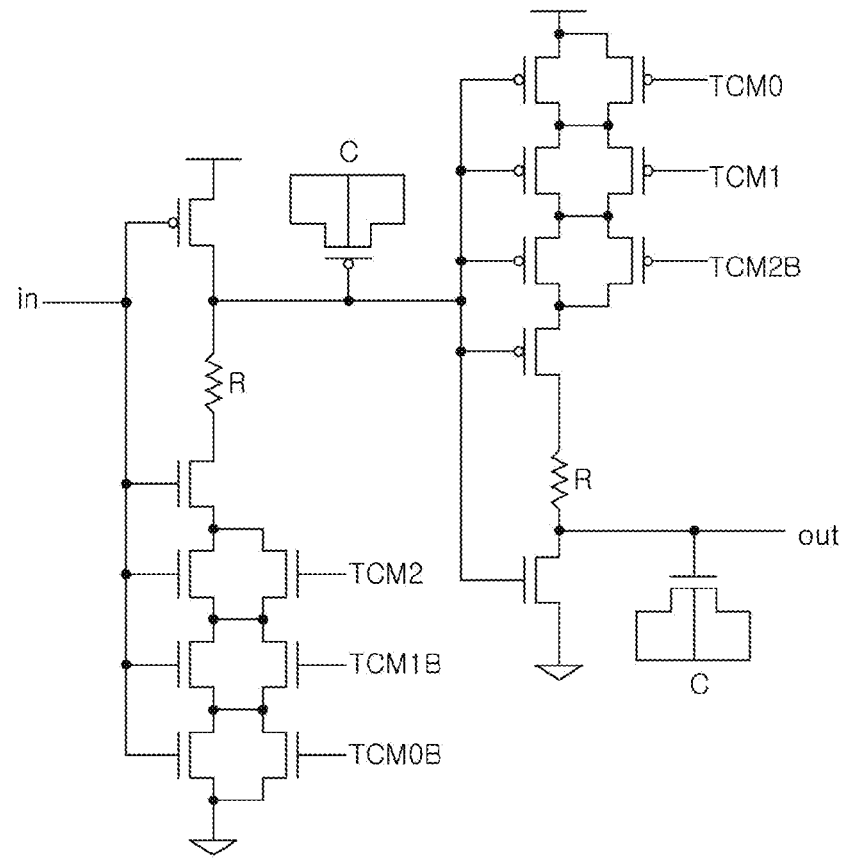
FIG. 1 is a diagram illustrating a typical delay circuit.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
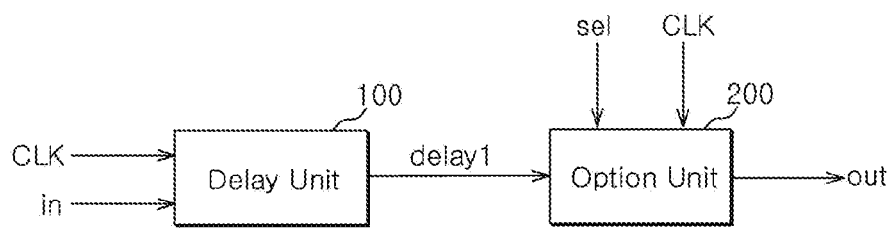
FIG. 2 is a block diagram illustrating a delay circuit in accordance with an embodiment of the present invention.

FIG. 2 is a block diagram illustrating a delay circuit in accordance with an embodiment of the present invention.

A delay circuit in accordance with the embodiment includes a delay unit 100 and an option unit 200.

The delay unit 100 is configured to receive a clock signal CLK, delay an input signal in sequence by a predetermined time interval, and generate a plurality of first delayed signals delay1.

In this disclosure, an "option unit", including the option unit 200, is defined as a circuit element that is capable of selecting one of a plurality of input signals based on a set of select signals which are also inputted to the circuit element, and outputting the selected input signal to a circuit element. Specifically, the option unit 200 is configured to select one of the plurality of first delayed signals delay1 based on one or more select signals sel and output a second delayed signal out. As is apparent from its circuit diagram, the option unit 200 functions as a multiplexer. Specifically, the option unit in FIG. 2 is a 2×1 multiplexer with one of the two inputs being selected based on the 2-bit select signals sel.

Since the delay unit 100 delays the input signal in sequence by the predetermined time interval based on the clock signal CLK, the delay circuit according to the embodiment of the present invention is less sensitive to a PVT variation than the typical delay circuit. Moreover, because the plurality of first delayed signals delay1, which are delayed sequentially by the predetermined time interval, have different delay times with respect to the input signal in, the delay circuit may output one of the first delayed signals delay1, which are generated by delaying the input signal in to have different delay times, as the second delayed signal out based on the select signals sel of the option unit 200.

Further, the option unit 200 may additionally receive the clock signal CLK to perform edge triggering operations for the plurality of first delayed signals delay1, and output one of the plurality of first delayed signals delay1, which have undergone the edge triggering operations, as the second delayed signal out based on the select signals sel.

Figure 3:
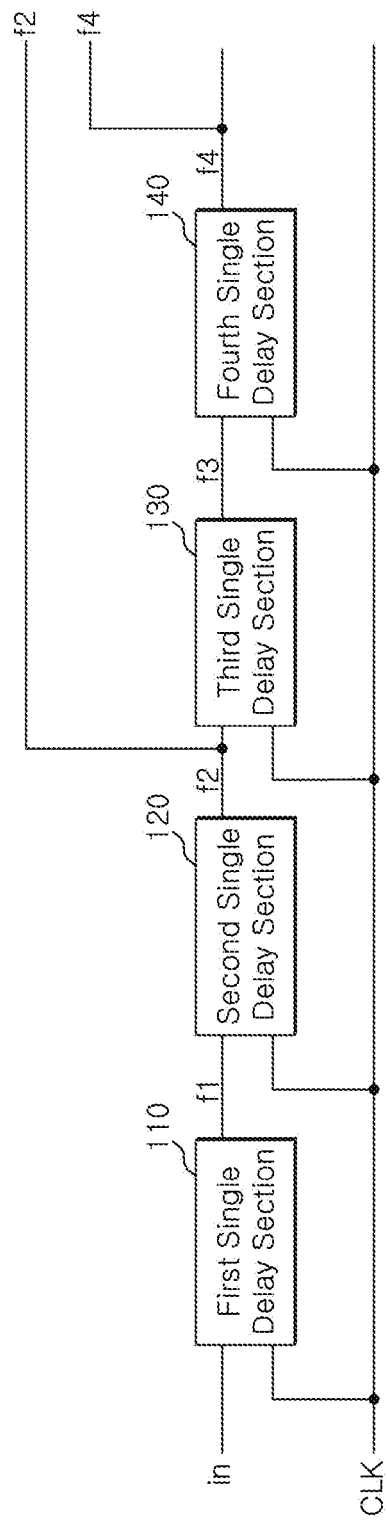
FIG. 3 is a detailed block diagram of the delay unit shown in FIG. 2.

FIG. 3 is a detailed block diagram of the delay unit 100 shown in FIG. 2. The delay unit 100 includes a plurality of single delay sections which are coupled in series in their input/output relationships. The delay unit 100 outputs a plurality of signals among signals outputted from the respective single delay sections, as the first delayed signals delay1. The single delay sections perform flip-flop operations for signals inputted thereto in synchronization with the clock signal CLK. As the single delay sections perform the flip-flop operations for the signals inputted thereto in synchronization with the clock signal CLK, the delay unit 100 delays the input signal in sequence by the predetermined time interval. FIG. 3 exemplifies that the delay unit 100 is configured to include four single delay sections which are coupled with one another. Hereafter, these four single delay sections will be respectively referred to as first through fourth single delay sections 110 through 140.

The four single delay sections 110 through 140 perform the flip-flop operations for the signals inputted thereto in synchronization with the clock signal CLK, and output resultant signals. The four single delay sections 110 through 140 may be configured by flip-flop circuits which are generally known in the art. The first single delay section 110 is configured to receive the input signal in, perform the flip-flop operation in synchronization with the clock signal CLK, and output a first flip-flop signal f1. The second single delay section 120 is configured to receive the first flip-flop signal f1, perform the flip-flop operation in synchronization with the clock signal CLK, and output a second flip-flop signal f2. The third single delay section 130 is configured to receive the second flip-flop signal f2, perform the flip-flop operation in synchronization with the clock signal CLK, and output a third flip-flop signal f3. The fourth single delay section 140 is configured to receive the third flip-flop signal f3, perform the flip-flop operation in synchronization with the clock signal CLK, and output a fourth flip-flop signal f4. The four single delay sections, that is, the first through fourth single delay sections 110 through 140 are coupled in series in their input/output relationships. Accordingly, the first flip-flop signal f1 is a signal which is generated by performing one time the flip-flop operation for the input signal in, the second flip-flop signal f2 is a signal which is generated by performing two times the flip-flop operation for the input signal in, the third flip-flop signal f3 is a signal which is generated by performing three times the flip-flop operation for the input signal in, and the fourth flip-flop signal f4 is a signal which is generated by performing four times the flip-flop operation for the input signal in. The delay unit 100 including the first through fourth single delay sections 110 through 140 outputs one or more of output signals of the four single delay sections 110 through 140 as the first delayed signals delay1. It is exemplified that the second flip-flop signal f2 and the fourth flip-flop signal f4 as the output signals of the second single delay section 120 and the fourth single delay section 140 are outputted as the first delayed signals delay1.

Figure 4:
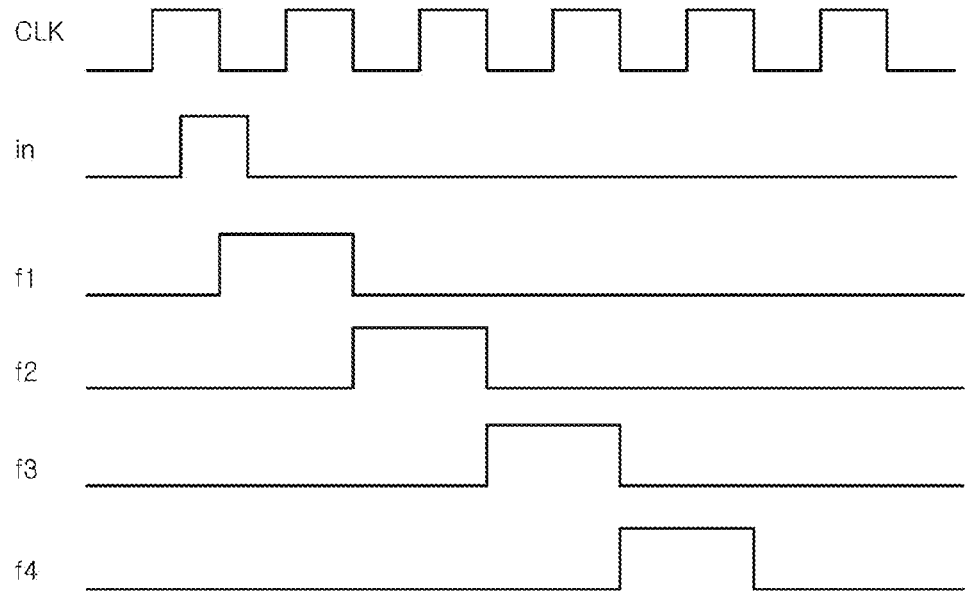
FIG. 4 is a waveform diagram illustrating input/output signals of the first through fourth single delay sections shown in FIG. 3.

FIG. 4 is a waveform diagram illustrating input/output signals of the first through fourth single delay sections 110 through 140 shown in FIG. 3. The single delay sections are configured to perform the flip-flop operations in which the signals inputted thereto are outputted based on falling edge timings of the clock signal CLK. As described above, the first through fourth single delay sections 110 through 140 are coupled in series in their input/output relationships. Therefore, the waveforms of the first through fourth flip-flop signals f1 through f4 have a pattern in which they are delayed with the same time interval. The delay unit 100 outputs one or more of the first through fourth flip-flop signals f1 through f4 having the pattern in which their waveforms are delayed with the same time interval, as the first delayed signals delay1. The four flip-flop signals f1 through f4 are exemplarily presented, and it is to be noted that the number of flip-flop signals may be changed variously depending upon what number of single delay sections are coupled with one another.

Figure 5:
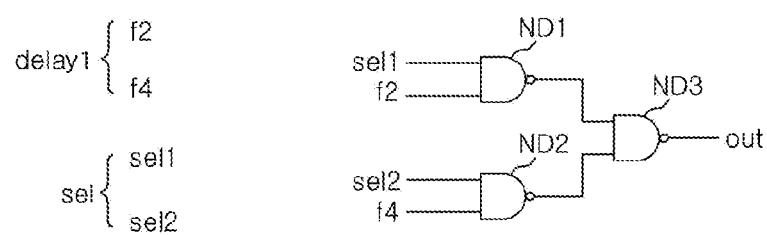
FIG. 5 is a circuit diagram illustrating one embodiment of the option unit shown in FIG. 2.

FIG. 5 is a circuit diagram illustrating one embodiment of the option unit 200 shown in FIG. 2. The option unit 200A shown in FIG. 5 includes a first NAND gate ND1, a second NAND gate ND2, and a third NAND gate ND3. The first NAND gate ND1 receives and NANDs first select signals sel1 as the select signals sel and the second flip-flop signal f2 as the first delayed signal delay1, and outputs a resultant signal. The second NAND gate ND2 receives and NANDs second select signals sel2 as the select signals sel and the fourth flip-flop signal f4 as the first delayed signal delay1, and outputs a resultant signal. The third NAND gate ND3 NANDs signals outputted from the first NAND gate ND1 and the second NAND gate ND2, and outputs a second delayed signal out.

If one of the first select signals sel1 and the second select signals sel2 as the select signals sel are inputted by being activated, a corresponding signal of the second flip-flop signal f2 and the fourth flip-flop signal f4 may be outputted as the second delayed signal out. Accordingly, the option unit 200A selects one of the flip-flop signals f2 and f4 with different delay times, that is, one of the plurality of first delayed signals delay1, based on the select signals sel, and outputs the selected signal as the second delayed signal out.

Figure 6:
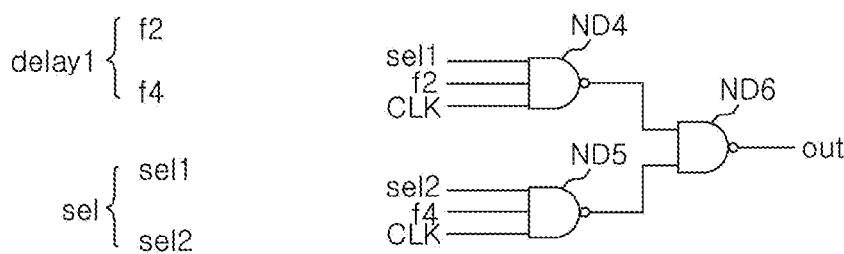
FIG. 6 is a circuit diagram illustrating another embodiment of the option unit shown in FIG. 2.

FIG. 6 is a circuit diagram illustrating another embodiment of the option unit 200 shown in FIG. 2.

The option unit 200B shown in FIG. 6 operates similarly to the option unit 200A shown in FIG. 5. The option unit 200B additionally receives the clock signal CLK to additionally perform edge triggering operations for the first delayed signals delay1.

The option unit 200B shown in FIG. 6 includes a first NAND gate ND4, a second NAND gate ND5, and a third NAND gate ND6.

The first NAND gate ND4 receives and NANDs the clock signal CLK, first select signals sel1 as the select signals sel and the second flip-flop signal f2 as the first delayed signal delay1, and outputs a resultant signal.

The second NAND gate ND5 receives and NANDs the clock signal CLK, second select signals sel2 as the select signals sel and the fourth flip-flop signal f4 as the first delayed signal delay1, and outputs a resultant signal.

The third NAND gate ND6 NANDs signals outputted from the first NAND gate ND4 and the second NAND gate ND5, and outputs the second delayed signal out.

If one of the first select signals sel1 and the second select signals sel2 as the select signals sel are inputted by being activated, a corresponding signal of the second flip-flop signal f2 and the fourth flip-flop signal f4 is edge-triggered based on the clock signal CLK and is outputted as the second delayed signal out. Accordingly, the option unit 200B selects and edge-triggers one of the flip-flop signals f2 and f4 with different delay times, that is, one of the plurality of first delayed signals delay1, based on the select signals sel, and outputs the edge-triggered signal as the second delayed signal out.

The delay circuit shown in FIGS. 2 through 6 operates as follows. The delay unit 100 delays the input signal in sequence by the predetermined time interval in synchronization with the clock signal CLK and outputs the plurality of first delayed signals delay1. The option unit 200 receives the plurality of first delayed signals delay1 and selects one of the plurality of first delayed signals delay1 based on the select signals sel or edge-triggers the plurality of first delayed signals delay1 and selects one of the plurality of edge-triggered first delayed signals delay1, and outputs the selected signal as the second delayed signal out.

The delay circuit in accordance with the embodiment of the present invention shown in FIGS. 2 through 6 provides the following advantages compared to the typical delay circuit. In the typical delay circuit, an input signal is delayed through RC delay depending upon current amounts of transistors and a delay time is controlled depending upon the current amounts of the transistors. Therefore, if current characteristics of the transistors are changed depending upon PVT (process, voltage and temperature) variations of a semiconductor apparatus, the delay time is also changed and high speed operation of the semiconductor apparatus is likely to be affected. In the delay circuit in accordance with the embodiment of the present invention, the input signal in is delayed by performing the flip-flop operations based on the clock signal CLK. In this regard, since the clock signal CLK is a stable signal which is relatively less influenced by semiconductor characteristics, the delay time can be stabilized. In particular, in the case where an external clock signal is received and used as the clock signal CLK, stability can be improved. Therefore, the delay circuit in accordance with the embodiment of the present invention becomes appropriate for high speed operation of a semiconductor apparatus when compared to the typical delay circuit.

Figure 7:
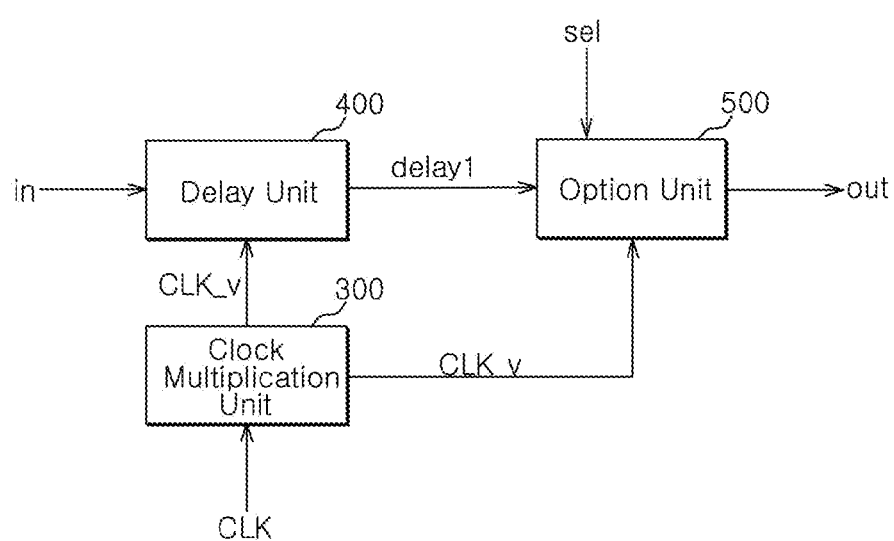
FIG. 7 is a block diagram illustrating a delay circuit in accordance with another embodiment of the present invention.

FIG. 7 is a block diagram illustrating a delay circuit in accordance with another embodiment of the present invention.

The delay circuit in accordance with another embodiment of the present invention includes a clock multiplication unit 300, a delay unit 400, and an option unit 500.

The clock multiplication unit 300 is configured to receive a clock signal CLK and output a plurality of multiplied clock signals CLK_v which have different cycles.

The delay unit 400 is configured to delay an input signal in sequence by a predetermined time interval through performing flip-flop operations in synchronization with the plurality of multiplied clock signals CLK_v and generate a plurality of first delayed signals delay1.

The option unit 500 is configured to receive the multiplied clock signals CLK_v, edge-trigger the first delayed signals delay1, select one of the plurality of edge-triggered first delayed signals delay1 based on one or more select signals sel, and output a second delayed signal out.

Unlike the delay circuit shown in FIG. 2 which implements delay through performing the flip-flop operations in synchronization with the clock signal CLK, since the delay circuit shown in FIG. 7 performs the flip-flop operations in synchronization with the multiplied clock signals CLK_v, the number of flip-flop operations necessary for a desired delay time can be decreased. For example, when assuming that 1 ns is delayed each time the single delay section of the delay circuit performs the flip-flop operation in synchronization with the clock signal CLK, 4 ns is delayed when the single delay section performs the flip-flop operation in synchronization with the multiplied clock signals CLK_v which have a cycle set to be 4 times longer than a cycle of the clock signal CLK. When it is necessary to achieve a delay time of total 40 ns using the single delay section which performs the flip-flop operation in synchronization with the clock signal CLK, the flip-flop operation should be performed 40 times, and 40 single delay sections which are coupled in series are needed. However, when the single delay section, which performs the flip-flop operation in synchronization with the multiplied clock signals CLK_v having a cycle set to be 4 times longer than the cycle of the clock signal CLK, is used, the flip-flop operations should be performed 10 times and 10 single delay sections which are coupled in series are needed. Due to a delay characteristic through a flip-flop operation, if a clock cycle is long, a delay time can be lengthened. Accordingly, by performing the flip-flop operation in synchronization with the multiplied clock signals CLK_v instead of the clock signal CLK, the number of flip-flop operations necessary for a desired delay time and a necessary area may be decreased.

Figure 8:
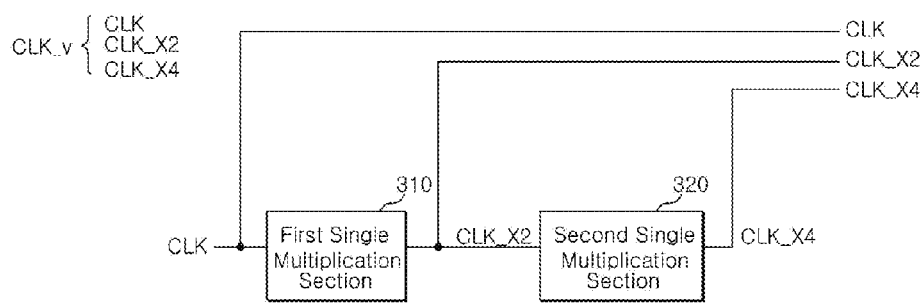
FIG. 8 is a detailed block diagram of the clock multiplication unit shown in FIG. 7.

FIG. 8 is a detailed block diagram of the clock multiplication unit 300 shown in FIG. 7.

The clock multiplication unit 300 includes one or more single multiplication sections. Each single multiplication section lengthens a cycle of a signal inputted thereto and outputs a resultant signal. The clock multiplication unit 300 outputs one or more of the clock signal CLK and signals outputted from the single multiplication sections, as the multiplied clock signals CLK_v. FIG. 8 exemplifies that two single multiplication sections each of which multiplies a clock cycle by two are included. These two single multiplication sections are respectively referred to as a first single multiplication section 310 and a second single multiplication section 320.

Each of the first single multiplication section 310 and the second single multiplication section 320 shown in FIG. 8 lengthens the cycle of a signal inputted thereto to two times and outputs a resultant signal. The first single multiplication section 310 is configured to receive the clock signal CLK, lengthen the cycle of the clock signal CLK to two times, and output a first clock signal CLK_X2. The second single multiplication section 320 is configured to receive the first clock signal CLK_X2, lengthen the cycle of the first clock signal CLK_X2 to two times, that is, lengthen the cycle of the clock signal CLK to four times, and output a second clock signal CLK_X4. The clock multiplication unit 300 outputs the clock signal CLK, the first clock signal CLK_X2 and the second clock signal CLK_X4 as the multiplied clock signals CLK_v.

The first single multiplication section 310 and the second single multiplication section 320, each of which lengthens the cycle of the signal inputted thereto to two times and outputs the resultant signal, may be configured using flip-flop circuits which are generally known in the art.

Figure 9:
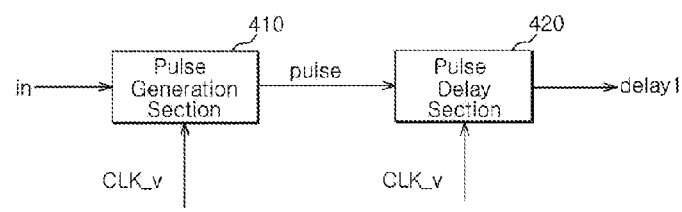
FIG. 9 is a detailed block diagram of the delay unit shown in FIG. 7.

FIG. 9 is a detailed block diagram of the delay unit 400 shown in FIG. 7.

Figure 11:
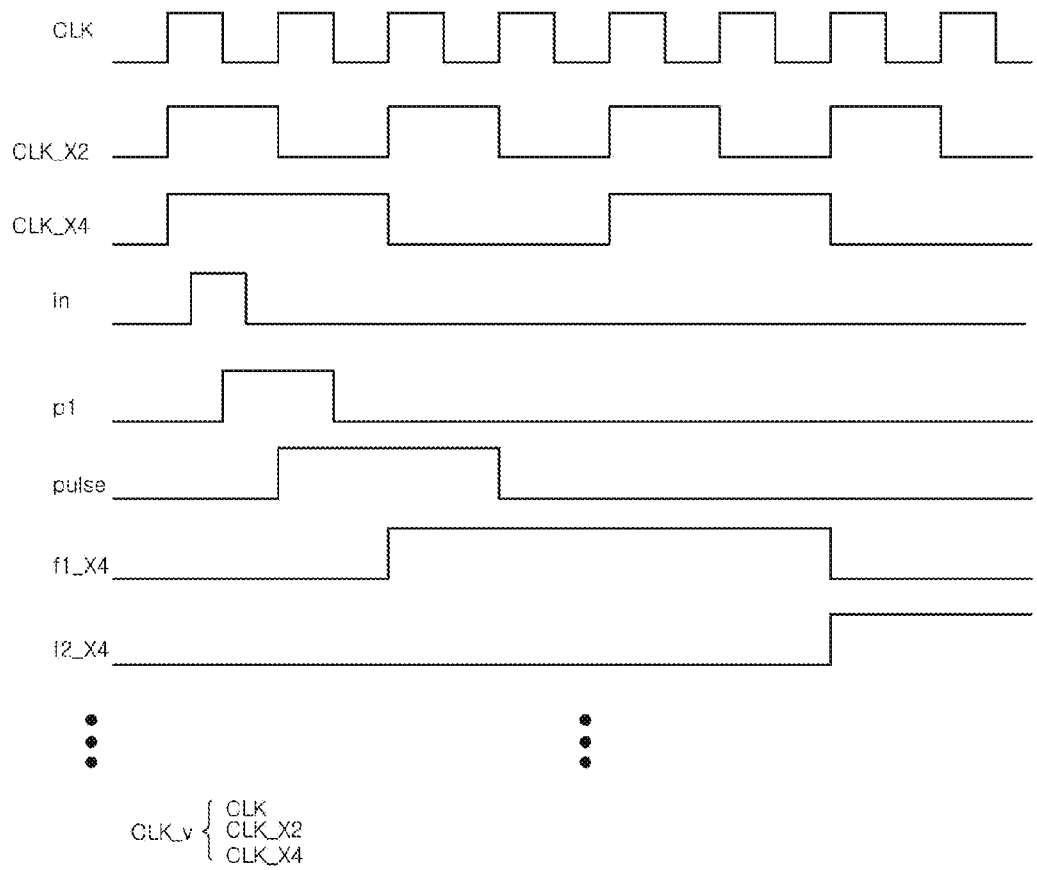
FIG. 11 is a waveform diagram illustrating input/output signals of the single delay stage included in the delay unit shown in FIG. 10.

FIG. 11 is a waveform diagram illustrating main signals of the delay circuit shown in FIGS. 7 through 9.

The delay unit 400 includes a pulse generation section 410 and a pulse delay section 420.

The pulse generation section 410 is configured to control a pulse width of the input signal in and output a pulse signal pulse. The pulse delay section 420 is configured to delay the pulse signal pulse sequentially by the predetermined time interval through performing flip-flop operations in synchronization with the multiplied clock signals CLK_v.

The pulse delay section 420 performs the flip-flop operations for signals inputted thereto in synchronization with the multiplied clock signals CLK_v. The pulse generation section 410 controls the pulse width of the input signal in and outputs the pulse signal pulse such that the pulse delay section 420 can perform the flip-flop operations. Speaking in detail, if an activation time of the input signal in is shorter than one halves of the cycles of the multiplied clock signals CLK_v, since the pulse delay section 420 performs the flip-flop operations in synchronization with the multiplied clock signals CLK_v, the delay of the input signal in cannot be implemented. It is illustrated in the timing diagram of FIG. 11 that high level widths of the first clock signal CLK_X2 and the second clock signal CLK_X4 are wider than the pulse width of the input signal in. Because the pulse width of the input signal in is narrower than a width between falling edges of the first clock signal CLK_X2 and a width between falling edges of the second clock signal CLK_X4, when the flip-flop operations for the input signal in are performed in synchronization with the first clock signal CLK_X2 and the second clock signal CLK_X4, information of the input signal in disappears. Hence, in order to enable the flip-flop operations to be performed in synchronization with the multiplied clock signals CLK_v, it is necessary to control the pulse width of the input signal in. The pulse generation section 410 controls the pulse width of the input signal in and outputs the pulse signal pulse such that the flip-flop operations can be performed in synchronization with the multiplied clock signals CLK_v.

The pulse delay section 420 delays the pulse signal pulse sequentially by the predetermined time interval by performing the flip-flop operations in synchronization with the multiplied clock signals CLK_v, and outputs the plurality of first delayed signals delay1.

Figure 10:
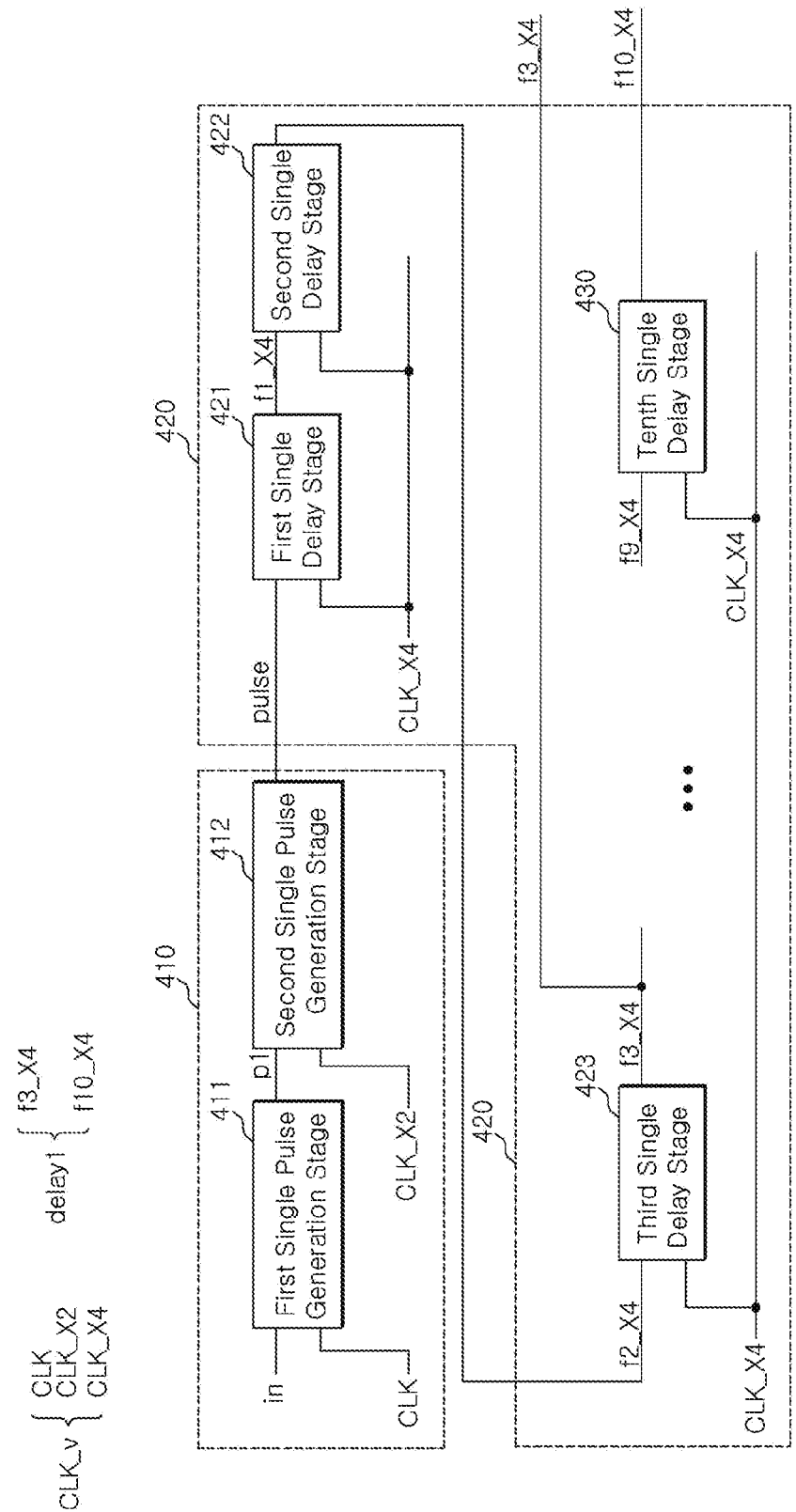
FIG. 10 is a detailed block diagram of the delay unit shown in FIGS. 7 and 9.

FIG. 10 is a detailed block diagram of the delay unit 400 shown in FIGS. 7 and 9.

As shown in FIG. 9, the delay unit 400 includes the pulse generation section 410 and the pulse delay section 420.

The pulse generation section 410 includes a plurality of single pulse generation stages which perform flip-flop operations for the signals inputted thereto in synchronization with the multiplied clock signals CLK_v and are coupled in series in their input/output relationships. FIG. 10 exemplifies that the pulse generation section 410 includes two single pulse generation stages. These two single pulse generation stages will be referred to as a first single pulse generation stage 411 and a second single pulse generation stage 412.

The first single pulse generation stage 411 is configured to perform a flip-flop operation for the input signal in in synchronization with the clock signal CLK and output a first pulse signal p1. Waveforms of the input signal in and the first pulse signal p1 are shown in the waveform diagram of FIG. 11.

The second single pulse generation stage 412 is configured to perform a flip-flop operation for the first pulse signal p1 in synchronization with the first clock signal CLK_X2 and output the pulse signal pulse. Waveforms of the first pulse signal p1 and the pulse signal pulse are shown in the waveform diagram of FIG. 11.

The input signal in is controlled in the pulse width thereof by the pulse generation section 410 in such a way as to enable the flip-flop operations to be performed in synchronization with the plurality of multiplied clock signals CLK_v, and is outputted as the pulse signal pulse.

The pulse delay section 420 includes a plurality of single delay stages which perform the flip-flop operations for the signals inputted thereto in synchronization with the plurality of multiplied clock signals CLK_v and are coupled in series in their input/output relationships. FIG. 10 exemplifies that the pulse delay section 420 includes ten single delay stages. These ten single delay stages will be referred to as first through tenth single delay stages 421 through 430.

The first through tenth single delay stages 421 through 430 perform the flip-flop operations for the signals inputted thereto in synchronization with the second clock signal CLK_X4 as the multiplied clock signal CLK_v and output resultant signals. Since the second clock signal CLK_X4 has a cycle longer than cycles of the clock signal CLK and the first clock signal CLK_X2, a delay degree becomes greater compared to the clock signal CLK and the first clock signal CLK_X2. The first single delay stage 421 is configured to receive the pulse signal pulse, perform the flip-flop operation in synchronization with the second clock signal CLK_X4, and output a first flip-flop signal f1_X4. The second single delay stage 422 is configured to receive the first flip-flop signal f1_X4, perform the flip-flop operation in synchronization with the second clock signal CLK_X4, and output a second flip-flop signal f2_X4. Like the first and second single delay stages 431 and 432, the third through tenth single delay stages 423 through 430 are configured to perform the flip-flop operations in synchronization with the second clock signal CLK_X4 and are coupled in series in their input/output relationships. The third through tenth single delay stages 423 through 430 output third through tenth flip-flop signals f3_X4 through f10_X4. In this way, the ten single delay stages, that is, the first through tenth single delay stages 421 through 430 are coupled in series in their input/output relationships. The delay unit 400 outputs one or more of the output signals of the ten single delay stages 421 through 430 as the plurality of first delayed signals delay1. It is exemplified that the third flip-flop signal f3_X4 and the tenth flip-flop signal f10_X4 as output signals of the third single delay stage 423 and the tenth single delay stage 430 are outputted as the plurality of first delayed signals delay1.

While the delay unit 400 shown in FIG. 10 includes the single delay stages which are coupled in series in their input/output relationships, like the delay unit 100 shown in FIG. 3, the delay unit 400 shown in FIG. 10 is distinguished from the delay unit 100 shown in FIG. 3 in that the flip-flop operations of the single delay stages are performed in synchronization with the multiplied clock signals CLK_v. Since the multiplied clock signals CLK_v can be set to have cycles longer than the clock signal CLK, the delay unit 400 shown in FIG. 9 can implement efficient delay through a decreased number of flip-flop operations, that is, using a decreased area, when compared to the delay unit 100 shown in FIG. 3. Waveforms of the internal signals p1, pulse and f1_X4 through f10_X4 based on the input signal in are illustrated in FIG. 11.

FIG. 11 shows a case in which the single delay stages are configured to perform D flip-flop operations and the signals inputted thereto are outputted based on falling edge timings of the multiplied clock signals CLK_v. As described above, the two single pulse generation stages 411 and 412 of the pulse generation section 410 and the single delay stages 421 through 430 of the pulse delay section 420 are coupled in series in their input/output relationships. Further, the first single pulse generation stage 411 performs the flip-flop operation based on the clock signal CLK, the second single pulse generation stage 412 performs the flip-flop operation based on the first clock signal CLK_X2, and the first through tenth single delay stages 421 through 430 perform the flip-flop operations based on the second clock signal CLK_X4. According to this fact, when observing the waveforms of the output signals p1, pulse and f1_X4 through f10_X4 shown in FIG. 11, it can be seen that a delay degree of the pulse signal pulse with respect to the first pulse signal p1 is greater than a delay degree of the first pulse signal p1 with respect to the input signal in. Also, it can be seen that a delay degree of the first flip-flop signal f1_X4 with respect to the pulse signal pulse is greater than the delay degree of the pulse signal pulse with respect to the first pulse signal p1. Delay degrees of the first through tenth flip-flop signals f1_X4 through f10_X4 are the same with one another since the flip-flop operations are performed in synchronization with the same second clock signal CLK_X4. In this way, due to the fact that the delay unit 400 shown in FIG. 10 performs the flip-flop operations in synchronization with clock signals having longer cycles when compared to the delay unit 100 shown in FIG. 3, delay can be implemented by decreasing the number of necessary flip-flop operations and a necessary area. The internal output signals p1, pulse and f1_X4 through f10_X4 are exemplarily presented, and it can be appreciated that internal output signals may be diversified depending upon which numbers of single pulse generation stages and single delay stages are coupled.

Figure 12:
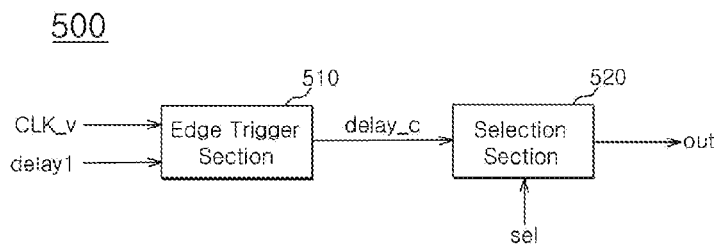
FIG. 12 is a detailed block diagram of the option unit shown in FIG. 7.

FIG. 12 is a detailed block diagram of the option unit 500 shown in FIG. 7.

The option unit 500 includes an edge trigger section 510 and a selection section 520.

The edge trigger section 510 is configured to receive the multiplied clock signals CLK_v and the plurality of first delayed signals delay1, perform edge triggering operations for the first delayed signals delay1, and output controlled delayed signals delay_c. As can be seen from FIG. 11, the plurality of first delayed signals delay1 have pulse widths which are considerably longer than the clock signal CLK. The edge trigger section 510 edge-triggers the plurality of first delayed signals delay1 with long pulse widths so that they can be easily used.

The selection section 520 is configured to receive the controlled delayed signals delay_c and select signals sel, select one among the controlled delayed signals delay_c, and output the second delayed signal out.

As described above, the plurality of first delayed signals delay1 constitute a portion of the output signals of the single delay stages which are included in the delay unit 400, and are edge-triggered by the edge trigger section 510. The selection section 520 selects one of the controlled delayed signals delay_c and outputs the second delayed signal out.

Figure 13:
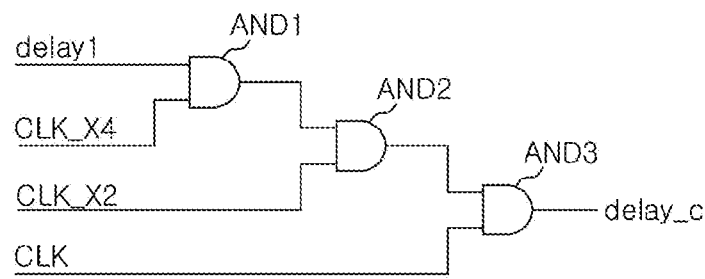
FIG. 13 is a detailed circuit diagram of the edge trigger section shown in FIG. 12.

FIG. 13 is a detailed circuit diagram of the edge trigger section 510 shown in FIG. 12.

The edge trigger section 510 includes a first AND gate AND1, a second AND gate AND2, and a third AND gate AND3. The first AND gate AND1 receives and ANDs the first delayed signal delay1 and the second clock signal CLK_X4 and outputs a resultant signal. The second AND gate AND2 ANDs the signal outputted from the first AND gate AND1 and the first clock signal CLK_X2 and outputs a resultant signal. The third AND gate AND3 ANDs the signal outputted from the second AND gate AND2 and the clock signal CLK and outputs the controlled delayed signal delay_c. As described above, since the first through tenth flip-flop signals among the internal signals of the delay unit 400 are generated through performing the flip-flop operations in synchronization with the second clock signal CLK_X4, they have waveforms in which high level periods are considerably longer than the clock signal CLK as can be seen from FIG. 11. The plurality of first delayed signals delay1 are edge-triggered through the operations of the first through third AND gates AND1 through AND3 of the edge trigger section 510 such that their high level periods are triggered like the high level period of the clock signal CLK, and are outputted as the controlled delayed signals delay_c.

Figure 14:
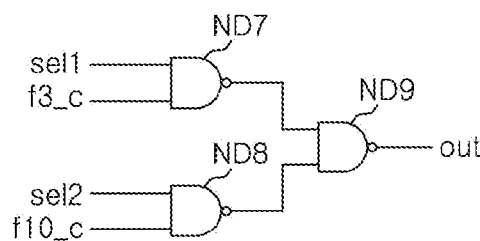
FIG. 14 is a detailed circuit diagram of the selection section shown in FIG. 12.

FIG. 14 is a detailed circuit diagram of the selection section 520 shown in FIG. 12.

The selection section 520 includes first through third NAND gates ND7 through ND9. The first NAND gate ND7 receives and NANDs a third controlled delayed signal f3_c as the controlled delayed signal delay_c and first select signals sel1 as the select signals sel, and outputs a resultant signal. The second NAND gate ND8 receives and NANDs a tenth controlled delayed signal f10_c as the controlled delayed signal delay_c and second select signals sel1 as the select signals sel, and outputs a resultant signal. The third NAND gate ND9 receives and NANDs signals outputted from the first NAND gate ND7 and the second NAND gate ND8, and outputs the second delayed signal out. The selection section 520 selects one of the controlled delayed signals delay_c based on the select signals sel through the operations of the first through third NAND gates ND7 through ND9, and outputs the second delayed signal out.

The delay circuit shown in FIGS. 7 through 13 operates as follows. The clock multiplication unit 300 receives the clock signal CLK and generates the plurality of clock signals CLK_v which have different cycles. In the delay unit 400, the pulse generation section 410 controls the pulse width of the input signal in and outputs the pulse signal pulse, and the pulse delay section 420 implements delay through performing the flip-flop operations in synchronization with the multiplied clock signals CLK_v and outputs the plurality of first delayed signals delay1. The edge trigger section 510 of the option unit 500 edge-triggers the first delayed signals delay1 and outputs the controlled delayed signals delay_c. The selection section 520 of the option unit 500 selects one of the controlled delayed signals delay_c and outputs the second delayed signal out.

The delay circuit shown in FIGS. 7 through 13 provides the following advantages when compared to the delay circuit shown in FIGS. 2 through 6. The delay circuit shown in FIGS. 7 through 13 includes the clock multiplication unit 300, generates the plurality of multiplied clock signals CLK_v which have different cycles, and performs the flip-flop operations based on the plurality of multiplied clock signals CLK_v. If a flip-flop operation is performed based on a clock signal with a longer cycle, since a delayed time is lengthened, the number of flip-flop operations necessary for the same delay time can be decreased. A decrease in the number of flip-flop operations means a decrease in the number of necessary single delay stages, which result in reduction of an area. As a desired delay time becomes long, the advantages attained by performing the flip-flop operations based on the multiplied clock signals CLK_v become great. Of course, the delay circuit in accordance with the embodiment of the present invention shown in FIGS. 7 through 13 provides advantages over the typical delay circuit in that, since delay is implemented based on the multiplied clock signals CLK_v, a delay time can be stably achieved even upon a PVT variation.

The clock multiplication unit 300 shown in FIG. 8 is exemplified in such a way as to receive the clock signal CLK and generate the second clock signal CLK_X4 which has a cycle 4 times longer than the cycle of the clock signal CLK. This is set in consideration of a case in which next activation of the input signal in does not come within 4 clocks. A maximum cycle of the multiplied clock signals CLK_v should be set in consideration of the activation timing of the input signal in. Since it is prescribed for a precharge signal generator of a semiconductor memory apparatus that tRRD (active to active time) should not be within 4 clocks. The multiplied clock signals CLK_v, which are generated by the clock multiplication unit 300 and are used by the delay unit 400 and the option unit 500, should be set to have a cycle that is 4 times longer at the maximum than the cycle of the clock signal CLK. As the tRRD becomes long, the cycle of the multiplied clock signals CLK_v may be set to be further lengthened, and an area reduction effect as described above will be ameliorated. Furthermore, when it is necessary to use the delay circuit according to the present invention in a precharge signal generator, an internal command signal may be included in the input signal in and a precharge signal may be included in the second delayed signal out.

While certain embodiments have been described above, it will be understood to those skilled in the art that the embodiments described are by way of example only. Accordingly, the delay circuit and the method for delaying a signal described herein should not be limited based on the described embodiments. Rather, the delay circuit and the method for delaying a signal described herein should only be limited in light of the claims that follow when taken in conjunction with the above description and accompanying drawings.

What is claimed is:

1. A delay circuit comprising:
a clock multiplication unit configured to multiply a clock signal and generate a plurality of multiplied clock signals which have different cycles;
a delay unit configured to delay an input signal sequentially by a predetermined time interval through performing flip-flop operations in synchronization with the plurality of multiplied clock signals, and generate a plurality of first delayed signals; and
an option unit configured to receive the plurality of multiplied clock signals, edge-trigger the plurality of first delayed signals, select one of the plurality of first delayed signals, which are edge-triggered, based on one or more select signals, and output a second delayed signal.

2. The delay circuit according to claim 1, wherein the clock multiplication unit comprises one or more single multiplication sections which lengthen cycles of signals inputted thereto, output resultant signals and are coupled in series in their input/output relationships, and outputs one or more of the clock signal and signals respectively outputted from the single multiplication sections, as the multiplied clock signals.

3. The delay circuit according to claim 2, wherein the single multiplication sections lengthen the cycles of the signals inputted thereto by performing flip-flop operations.

4. The delay circuit according to claim 3, wherein cycles of the plurality of multiplied clock signals are shorter than a time interval from a time when the input signal is inputted to a time when a next input signal is inputted.

5. The delay circuit according to claim 1, wherein the delay unit comprises:
a pulse generation section configured to control a pulse width of the input signal based on the plurality of multiplied clock signals, and output a pulse signal; and
a pulse delay section configured to delay the pulse signal sequentially by the predetermined time interval through performing the flip-flop operations in synchronization with the plurality of multiplied clock signals.

6. The delay circuit according to claim 5, wherein the pulse generation section comprises a plurality of single pulse generation stages which perform flip-flop operations in synchronization with the plurality of multiplied clock signals and are coupled in series, and outputs the pulse signal by controlling the pulse width of the input signal.

7. The delay circuit according to claim 5, wherein the pulse delay section comprises a plurality of single delay stages which perform the flip-flop operations for signals inputted thereto in synchronization with the plurality multiplied clock signals and are coupled in series, and outputs a plurality of signals among signals respectively outputted from the single delay stages, as the plurality of first delayed signals.

8. The delay circuit according to claim 1, wherein the option unit comprises:
   an edge trigger section configured to receive the plurality of first delayed signals and the plurality of multiplied clock signals, perform edge triggering operations, and output controlled delayed signals; and
   a selection section configured to select one of the controlled delayed signals based on the select signals and output the second delayed signal.

9. The delay circuit according to claim 1, wherein the input signal comprises an internal command signal of a semiconductor memory apparatus, and the second delayed signal comprises a precharge signal.

10. A method for delaying a signal, comprising the steps of:
    generating a plurality of multiplied clock signals which have different cycles in response to a clock signal;
    receiving an input signal, performing sequentially flip-flop operations a multitude of times in synchronization with the plurality of multiplied clock signals, and generating a plurality of first delayed signals;
    edge-triggering the plurality first delayed signals in response to the plurality of multiplied clock signals; and
    outputting one of the first delayed signals which are edge-triggered, as a second delayed signal.

11. The method according to claim 10, wherein the step of generating the plurality of first delayed signals comprises the steps of:
    receiving the input signal, performing the flip-flop operations in synchronization with the plurality of multiplied clock signals, and generating a pulse signal; and
    performing the flip-flop operations for the pulse signal in synchronization with one of the plurality of multiplied clock signals, and generating the plurality of first delayed signals.

12. The method according to claim 11, wherein the one of the plurality of multiplied clock signals is a multiplied clock signal which has a longest cycle among the plurality of multiplied clock signals.

13. The method according to claim 12,
    wherein the method for delaying a signal is repeatedly implemented, and
    wherein a cycle of the one of the plurality of multiplied clock signals is shorten than a time interval from a time when the input signal is inputted to a time when a next input signal is inputted.

14. The method according to claim 10, wherein the step of generating the plurality of multiplied clock signals comprises the steps of:
    performing a flip-flop operation for the clock signal and generating a first multiplied clock signal which has a cycle two times longer than the clock signal; and
    performing a flip-flop operation for the first multiplied clock signal and generating a second multiplied clock signal which has a cycle four times longer than the clock signal.

15. The method according to claim 14, wherein the step of edge-triggering the plurality of first delayed signals comprises the steps of:
    a) ANDing the plurality of first delayed signals and the second multiplied clock signal;
    b) ANDing a signal generated in the step a) and the first multiplied clock signal; and
    c) ANDing a signal generated in the step b) and the clock signal.

* * * * *